United States Patent
Jeong et al.

(10) Patent No.: US 8,906,568 B2
(45) Date of Patent: Dec. 9, 2014

(54) MONITORING THE OPERATIONAL STATE OF A FUEL CELL STACK

(75) Inventors: Kwi Seong Jeong, Gyeonggi-do (KR); Seung Chan Oh, Gyeonggi-do (KR); Young Bum Kum, Seoul (KR); Sae Hoon Kim, Gyeonggi-do (KR); Jung Do Suh, Seoul (KR); Duck Whan Kim, Seoul (KR); Young Hyun Lee, Seoul (KR); Seung Ryeol Yoo, Chungcheongnam-do (KR); Myung Ju Jung, Daejeon (KR); Jong Guen Yoon, Chungcheongnam-do (KR)

(73) Assignees: Hyundai Motor Company, Seoul (KR); Kangnam University Industry-Academia Cooperation Foundation, Yongin, Gyeonggi-Do (KR)

( * ) Notice: Subject to any disclaimer, the term of this patent is extended or adjusted under 35 U.S.C. 154(b) by 653 days.

(21) Appl. No.: 13/109,819

(22) Filed: May 17, 2011

(65) Prior Publication Data
US 2012/0135327 A1    May 31, 2012

(30) Foreign Application Priority Data
Nov. 25, 2010 (KR) .................... 10-2010-0117862

(51) Int. Cl.
  *H01M 8/04* (2006.01)
  *G01R 31/36* (2006.01)
  *H01M 8/10* (2006.01)

(52) U.S. Cl.
  CPC ....... *H01M 8/04992* (2013.01); *G01R 31/3606* (2013.01); *H01M 8/04589* (2013.01); *H01M 2250/20* (2013.01); *H01M 8/04559* (2013.01); *H01M 8/04313* (2013.01); *H01M 2008/1095* (2013.01); *Y02E 60/50* (2013.01); *Y02T 90/32* (2013.01)
  USPC .......................................... 429/431; 429/432

(58) Field of Classification Search
  USPC .................................. 429/431, 432
  See application file for complete search history.

(56) References Cited

U.S. PATENT DOCUMENTS

| 6,762,587 | B1 | 7/2004 | Barbetta |
| 7,531,253 | B2 | 5/2009 | Ramschak |
| 2005/0136301 | A1 | 6/2005 | Knaggs et al. |
| 2006/0078788 | A1* | 4/2006 | Ramschak ...................... 429/90 |

FOREIGN PATENT DOCUMENTS

| JP | 2006107937 A | 4/2006 |
| JP | 2009104870 A | 5/2009 |
| JP | 2009170223 A | 7/2009 |

\* cited by examiner

*Primary Examiner* — Ula C. Ruddock
*Assistant Examiner* — Frank Chernow
(74) *Attorney, Agent, or Firm* — Edwards Wildman Palmer LLP; Peter F. Corless

(57) ABSTRACT

A technique is described herein for monitoring the operational state of a fuel cell stack by the detection of nonlinearity in such a manner that an external test signal for frequency response is generated and applied to the fuel cell stack during operation, the resulting signal output from the fuel cell stack is measured, and the harmonic content of the measured signal is analyzed, the method including: applying a multiple frequency test signal comprising at least two sinusoidal waves as the test signal for frequency response to the fuel cell stack; and analyzing the resulting current or voltage signal output from the fuel cell stack.

5 Claims, 5 Drawing Sheets

MONITORING THE OPERATIONAL STATE OF A FUEL CELL STACK

CROSS-REFERENCE TO RELATED APPLICATION

This application claims under 35 U.S.C. §119(a) the benefit of Korean Patent Application No. 10-2010-0117862 filed Nov. 25, 2010, the entire contents of which are incorporated herein by reference.

BACKGROUND (a) Technical Field

The present invention relates to monitoring the operational state of a fuel cell stack. More particularly, it relates to monitoring the operational state of unit cells of the fuel cell stack and the occurrence of deterioration in performance in real time and detecting nonlinearity of the current or voltage signal of the fuel cell stack.

(b) Background Art

A fuel cell is an electricity generation system that does not convert chemical energy of fuel into heat by combustion, but instead electrochemically converts the chemical energy directly into electrical energy in a fuel cell stack. The fuel cell can be applied to the electric power supply of small-sized electrical and electronic devices, for example portable devices, as well as industrial and household appliances and vehicles.

One of the most attractive fuel cells for a vehicle is a proton exchange membrane fuel cell or a polymer electrolyte membrane fuel cell (PEMFC), which has the highest power density among other fuel cells. The PEMFC has a fast start-up time and a fast reaction time for power conversion due to its low operation temperature.

The fuel cell stack included in the PEMFC comprises a membrane electrode assembly (MEA), a gas diffusion layer (GDL), a gasket, a sealing member, and a bipolar plate. The MEA includes a solid polymer electrolyte membrane through which hydrogen ions are transported. An electrode/catalyst layer, in which an electrochemical reaction takes place, is disposed on each of both sides of the polymer electrolyte membrane. The GDL functions to uniformly diffuse reactant gases and transmit generated electricity. The gasket functions to provide an appropriate airtightness to reactant gases and coolant. The sealing member functions to provide an appropriate bonding pressure. The bipolar plate functions to support the MEA and GDL, collect and transmit generated electricity, transmit reactant gases, transmit and remove reaction products, and transmit coolant to remove reaction heat, etc.

When the fuel cell stack is assembled with the unit cells, a combination of the MEA and the GDL is positioned in the center of each unit cell of the fuel cell stack. The MEA comprises an electrode/catalyst layer such as an air electrode (cathode) and a fuel electrode (anode), in which an electrochemical reaction between hydrogen and oxygen takes place, disposed on each of both sides of the polymer electrolyte membrane. Moreover, the GDL and the gasket are sequentially stacked on both sides of the MEA, where the cathode and the anode are located.

The bipolar plate including flow fields for supplying reactant gases (hydrogen as a fuel and oxygen or air as an oxidant) and transmitting coolant is located on the outside of the GDL. After a plurality of unit cells are stacked together, a current collector, an insulating plate, and an end plate for supporting the stacked unit cells are connected to the outermost ends of the fuel cell stack. The plurality of unit cells are repeatedly stacked and connected in series between the end plates, thereby completing the manufacturing the fuel cell stack.

Typically, the unit cells in a required amount are stacked together to obtain a potential required for an actual vehicle. For example, since an electrical potential generated by one unit cell is about 1.3 V, a plurality of unit cells are generally stacked in series to generate enough power required for driving a vehicle.

Meanwhile, in a fuel cell vehicle, the cell voltage is used to determine the performance, the operational state of the fuel cell stack, and the occurrence of a failure. Moreover, the cell voltage is used to control various operations such as the flow rate of reactant gas. Typically, the bipolar plate is connected to a cell voltage monitoring system through a connector or lead wire to monitor the cell voltage.

A conventional cell voltage monitoring (CVM) system directly monitors the voltage of all cells or two cells, in which the monitored information is processed by a master controller (i.e., superior controller) collecting the voltage of all cells. The CVM system monitors a voltage drop due to a failure, not the cause of the failure.

The CVM system is also used to monitor the operational state of a battery. FIG. 1 is a diagram showing a circuit configuration of a conventional CVM system, in which a total of 32 cells are connected in series.

The conventional CVM system can determine the position of a faulty cell as it directly monitors the cell voltage. However, as can be seen from FIG. 1, the conventional CVM system has a very complicated circuit configuration, and thus it is difficult to configure and maintain the system. Moreover, the system is very expensive, and it is unable to determine the cause of the failure.

Moreover, an electrochemical impedance spectroscopy (EIS) may also be used conventionally, and it is mainly used in the field of electrochemistry to determine the characteristics of electrode reactions or complexes. The EIS can obtain comprehensive information related to the properties, structures, and reactions of complexes by the analysis of the system response and is used as a useful tool in the fields of applied chemistry, medical engineering, and bioengineering.

However, the EIS is used off-line (that is, not during real-time operation of a fuel cell stack) and thus requires a long test time. Moreover, it is not suitable for real-time detection, requires a high cost, and is used only to analyze a unit cell.

U.S. Pat. No. 7,531,253 discloses a method for monitoring the operational state of a fuel cell stack in which a low-frequency current $[I_{test}(t)]$ or voltage signal is applied to the fuel cell stack and the resulting current or voltage $[V(t)]$ signal is measured to infer the operational state of individual cells of the fuel cell stack from a change in the harmonic content and the amplitude of the measured current or voltage signal.

According to this method, a drop in cell voltage is detected by a change of a linear region of the V/I (voltage/current) characteristic curve into a nonlinear state, and the possible failure of the system can be monitored by measuring all signals of the fuel cell stack.

The basic concept of this method is to monitor the operational state of the fuel cell stack on the basis of measuring only the voltage of the fuel cell stack. That is, the operational state of individual cells of the fuel cell stack is inferred from a change in the voltage of the fuel cell stack due to a change in current by frequency analysis.

As shown in FIG. 2, the voltage/current characteristics of the fuel cell stack are linear during normal operation and nonlinear under abnormal operation conditions. That is, if nonlinearity occurs in the cell voltages of the fuel cell stack, it can be determined that the operational state of the fuel cell stack is abnormal.

During operation of the fuel cell stack to which a load is connected, a sinusoidal test current [(B sin(ωt)] for frequency response is additionally applied to the fuel cell stack and, at this time, the current of the fuel cell stack is the sum of the basic operating current and the sinusoidal current [the current of the fuel cell stack=A+B sin(ωt)].

However, the above-described method uses a small sinusoidal current change as an input, and thus it has a low analytical capacity. Therefore, a method for improving the analytical capacity is required.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention provides a technique for monitoring the operational state of a fuel cell stack, in which an external test signal for frequency response is applied to the fuel cell stack and nonlinearity of the resulting signal output from the fuel cell stack is detected to infer the operational state of unit cells of the fuel cell stack, thus improving the analytical capability.

In one aspect, the present invention provides a method for monitoring the operational state of a fuel cell stack by the detection of nonlinearity in such a manner that an external test signal for frequency response is generated and applied to the fuel cell stack during operation, the resulting signal output from the fuel cell stack is measured, and the harmonic content of the measured signal is analyzed, the method comprising: applying a multiple frequency test signal comprising at least two sinusoidal waves as the test signal for frequency response to the fuel cell stack; and analyzing the resulting current or voltage signal output from the fuel cell stack.

Other aspects and preferred embodiments of the invention are discussed hereinafter.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
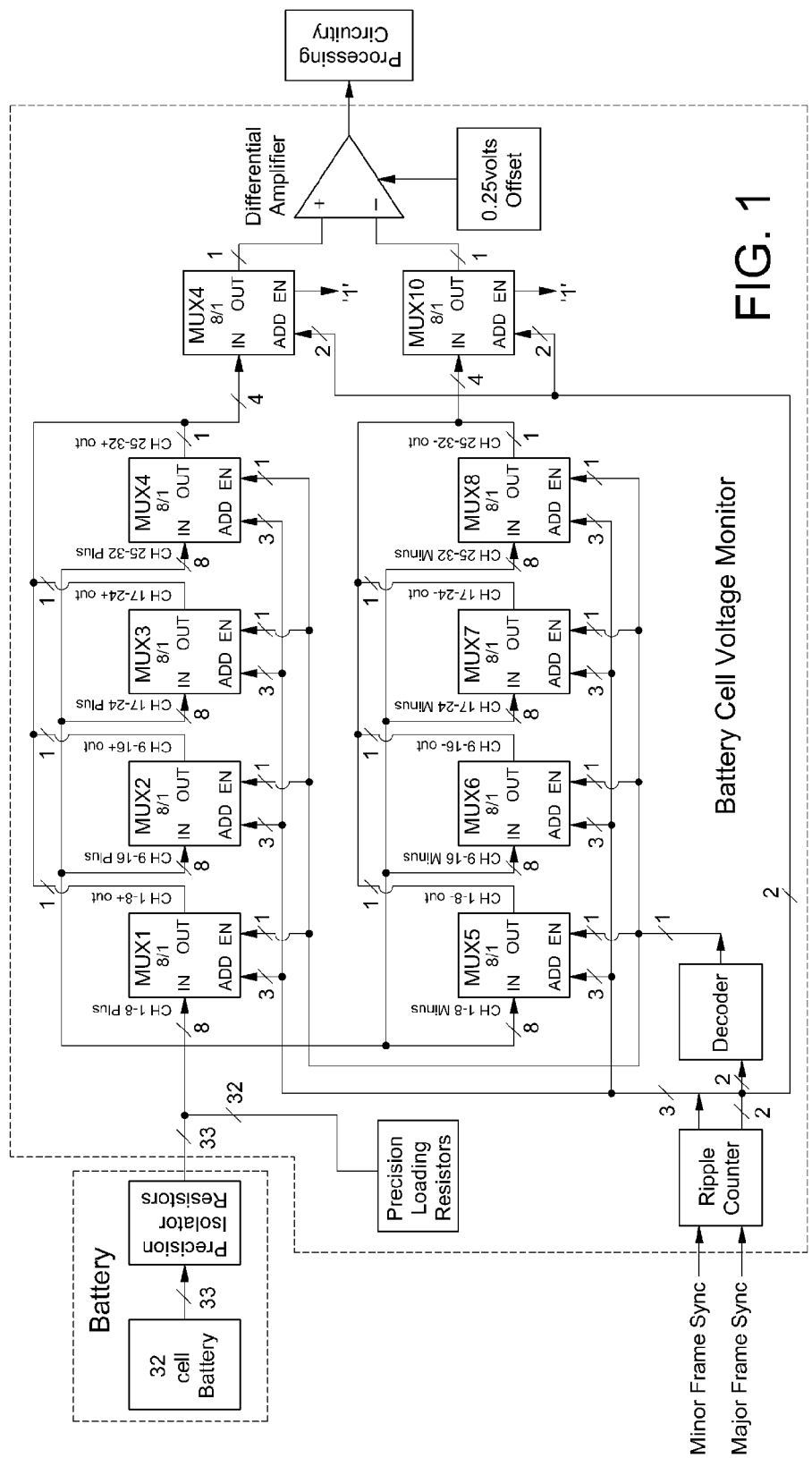
FIG. 1 is a diagram showing a circuit configuration of a conventional cell voltage monitoring (CVM) system.

Reference numerals set forth in the Drawings includes reference to the following elements as further discussed below:

10: fuel cell stack;
20: load;
30: monitoring device;
31: signal generator; and
32: signal line.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Also, it is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The present invention provides a technique for monitoring the operational state of a fuel cell stack that can monitor the operational state of unit cells of a fuel cell stack of a polymer electrolyte membrane fuel cell and the occurrence of deterioration in performance in real time with a simple device configuration.

Moreover, the present invention provides a monitoring technique which can be performed with a simple device configuration and thus can be packaged in a small module at low cost. The monitoring technique of the present invention can perform real-time monitoring and has excellent stability.

In particular, the present invention aims at improving analytical capability by modifying a conventional method for monitoring the operational state of a fuel cell stack in which an external test signal for frequency response, i.e., a low-frequency current $[I_{test}(t)]$ or voltage signal, is applied to the fuel cell stack and the resulting signal output from the fuel cell stack, i.e., the resulting current or voltage [V(t)] signal, is measured to infer the operational state of individual cells of the fuel cell stack from a change in the harmonic content and the amplitude of the measured current or voltage signal.

In the present invention, all signals of the fuel cell stack are measured to detect and investigate a failure of the unit cell, and thus it is possible to provide a simple device configuration, reduce the cost, and increase the stability due to a reduction in circuitry.

Moreover, when a monitoring device of the present invention is configured and applied to a fuel cell vehicle, it is possible to detect a failure of the fuel cell stack through real-time monitoring, such that replacement and repair may be performed efficiently, thereby contributing to a reduction in maintenance cost.

According to the techniques described herein for monitoring the operational state of a fuel cell stack by the detection of nonlinearity, a multiple frequency input is used when a test signal for frequency response is applied to the fuel cell stack. The resulting signal output from the fuel cell stack is then measured and used to infer the operational state of individual cells of the fuel cell stack based on a change in the harmonic content and the amplitude of the measured signal.

That is, according to the techniques herein, a multiple frequency test signal for frequency response is generated and input to the fuel cell stack. The resulting signal output from the fuel cell stack is then frequency-analyzed to infer the operational state of the fuel cell stack and the unit cells.

Figure 3:
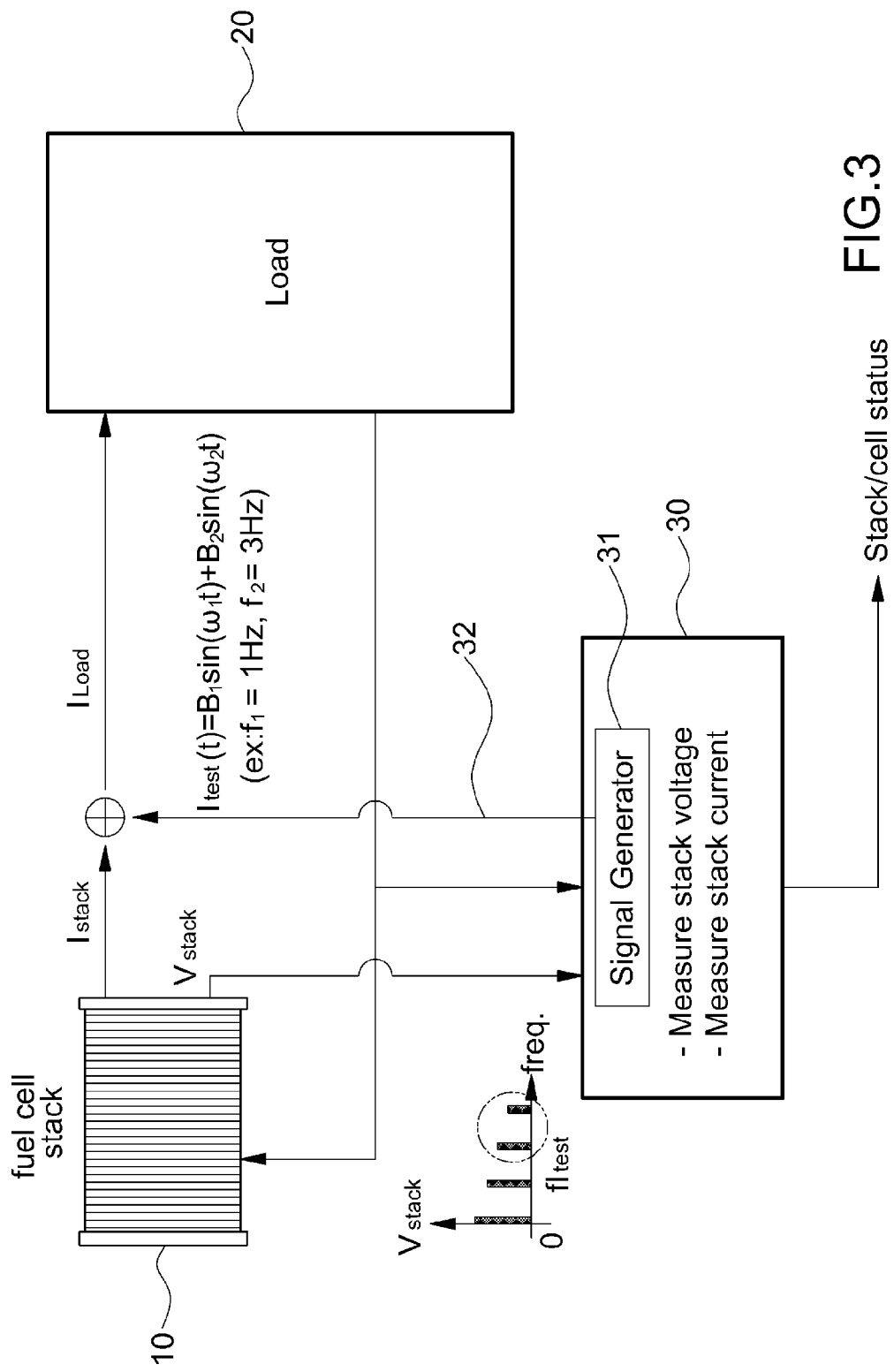
FIG. 3 is a schematic diagram showing a monitoring device for performing a monitoring process in accordance with an illustrative embodiment of the present invention.

FIG. 3 is a schematic diagram showing a monitoring device for performing a monitoring process in accordance with an illustrative embodiment of the present invention. As shown in the figure, a monitoring device 30 comprises a current signal generator 31 for generating a test signal for frequency response [e.g., a test current $I_{test}(t)$], the signal generator 31 applying a test signal for frequency response to a load connection terminal (e.g., a main bus terminal) of a fuel cell stack 10 through a signal line 32.

In a particular illustrative embodiment of the present invention, the signal generator 31 generates and outputs a multiple frequency test signal for frequency response, e.g., a multiple frequency test current, and the test current output from the signal generator 31 is applied to the operating current ($I_{stack}$) of the fuel cell stack 10.

Moreover, the monitoring device 30 measures the voltage ($V_{stack}$) and current of the fuel cell stack 10. In the present invention, the voltage of the entire fuel cell stack is measured and frequency-analyzed, instead of directly measuring the cell voltage, thus monitoring the operational state of the fuel cell stack and the unit cells.

Therefore, it is possible to improve the analytical capability more than two times by the use of the multiple frequency test signal, compared to the case of using a single frequency test signal, and the measurement of the voltage of the entire fuel cell stack allows the configuration of the monitoring device to be simplified, as described herein.

In the above-described device configuration, during operation of the fuel cell stack 10 to which a load 20 is connected, a sinusoidal test current for frequency response generated by the signal generator 31 is additionally applied to the operating current ($I_{stack}$) output from the fuel cell stack to monitor the operational state of the fuel cell stack, and this test current is the sum of at least two sinusoidal currents [e.g., $I_{test}(t)=B_1 \sin(\omega_1 t)+B_2 \sin(\omega_2 t)$].

Figure 2:
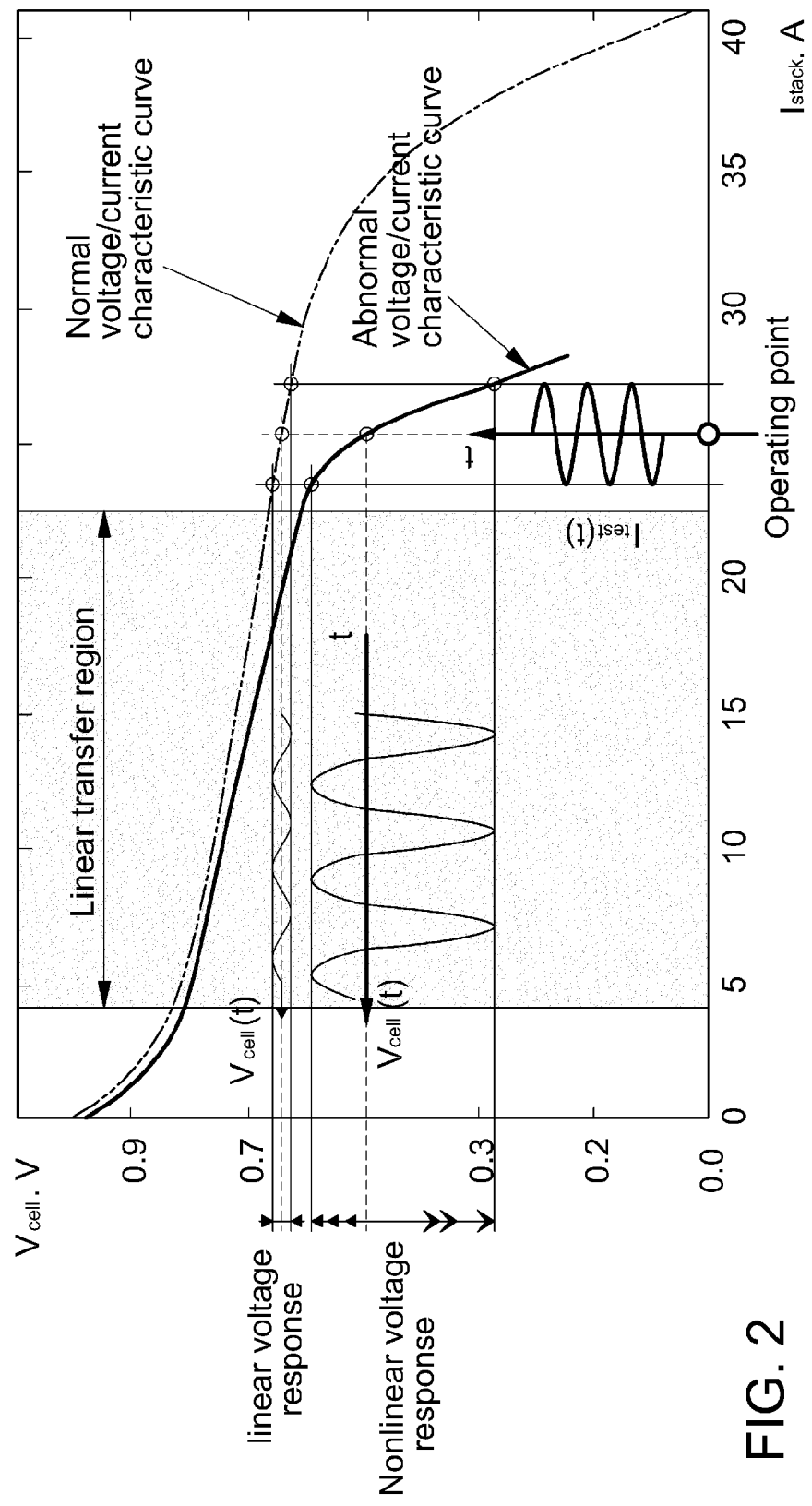
FIG. 2 is a diagram showing a conventional method for monitoring the operational state of unit cells by the detection of nonlinearity, in which voltage/current characteristic curves obtained when a single frequency test current is applied to normal and abnormal cells are shown.
Figure 4:
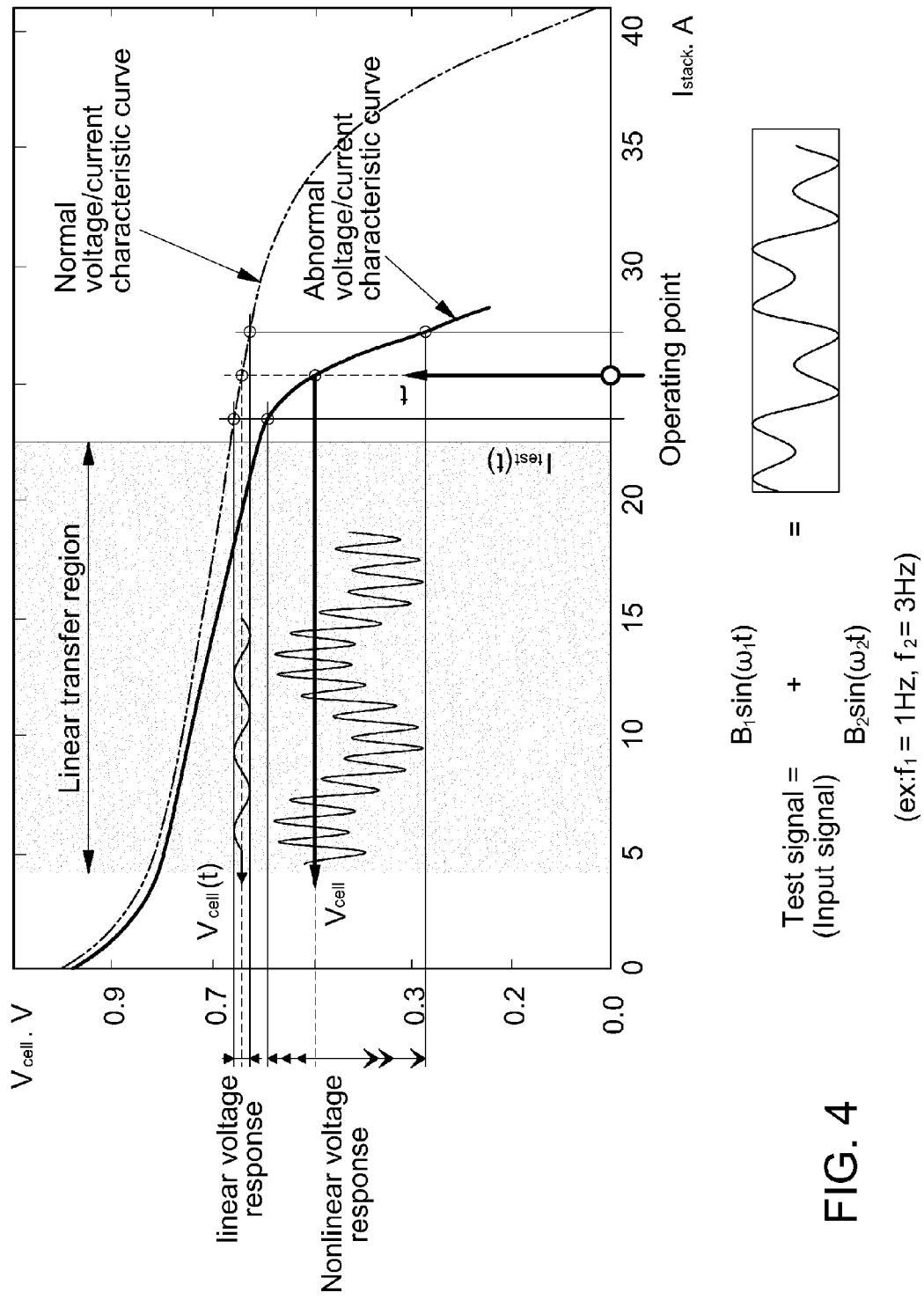
FIG. 4 is a diagram showing a method for monitoring the operational state of unit cells by the detection of nonlinearity in accordance with an illustrative embodiment of the present invention, in which voltage/current characteristic curves obtained when a multiple frequency test current is applied to normal and abnormal cells are shown.

FIG. 4 is a diagram showing a technique for monitoring the operational state of unit cells by the detection of nonlinearity in accordance with an illustrative embodiment of the present invention, in which voltage/current characteristic curves obtained when a multiple frequency test current is applied to normal and abnormal cells are shown, which corresponds to FIG. 2.

Here, the voltage of a normal cell (shown by an alternate long and short dash line) is changed in a linear region, and that of an abnormal cell (shown by a solid line) is changed in a nonlinear region.

A rapid voltage drop in the abnormal cell during operation is caused by a failure of the cell. In this case, when an external sinusoidal test current [$I_{test}(t)$] is applied, a distorted response signal (i.e., the voltage signal of the abnormal cell), which generates harmonics in the abnormal cell, is generated (i.e., the total harmonic distortion (THD) increases), unlike the normal cell.

Therefore, it is possible to monitor the operational state of the normal and abnormal cells from the harmonic content and the amplitude of the voltage signal.

While the voltage of the normal cell has small distortion due to a change in current, the voltage of the abnormal cell has large voltage amplitude and distortion due to the change in current.

The voltage of the fuel cell stack is measured as the sum of the voltages of the normal cells and those of the abnormal cells, and the voltages of the cells are measured by calculating the total harmonic distortion (K) by frequency analysis of the voltage of the fuel cell stack.

The illustrative waveform of the current used in the present invention as the test signal for frequency response input from the outside is shown in the bottom of FIG. 4.

In the present invention, the current of the fuel cell stack is the sum of the basic operating current ($I_{stack}=A$) and the multiple frequency sinusoidal current as the current signal for frequency response and can be represented by the following formula 1:

$$\text{Current of a fuel cell stack}=A+B_1 \sin(\omega_1 t)+B_2 \sin(\omega_2 t) \quad \text{[Formula 1]}$$

wherein A represents the basic operating current of the fuel cell stack, $B_1 \sin(\omega_1 t)+B_2 \sin(\omega_2 t)$ represents the multiple frequency sinusoidal current, $B_1$ and $B_2$ represent the amplitudes, and $\omega_1$ and $\omega_2$ represent the frequencies.

Moreover, the voltage [V(t)] of the fuel cell stack can be represented by the following formula 1:

$$V(t)=Y_0+Y_1 \sin(\omega_1 t)+Y_2 B \sin(\omega_2 t)+Y_3 \sin(2\omega_1 t)+Y_4 \sin((\omega_2-\omega_1)t)+Y_5 \sin(2\omega_2 t)+Y_6 \sin((\omega_1+\omega_2)t) \quad \text{[Formula 2]}$$

wherein $Y_0$, $Y_1$, $Y_2$, $Y_3$, $Y_4$, $Y_5$ and $Y_6$ represent the amplitudes.

Figure 5:
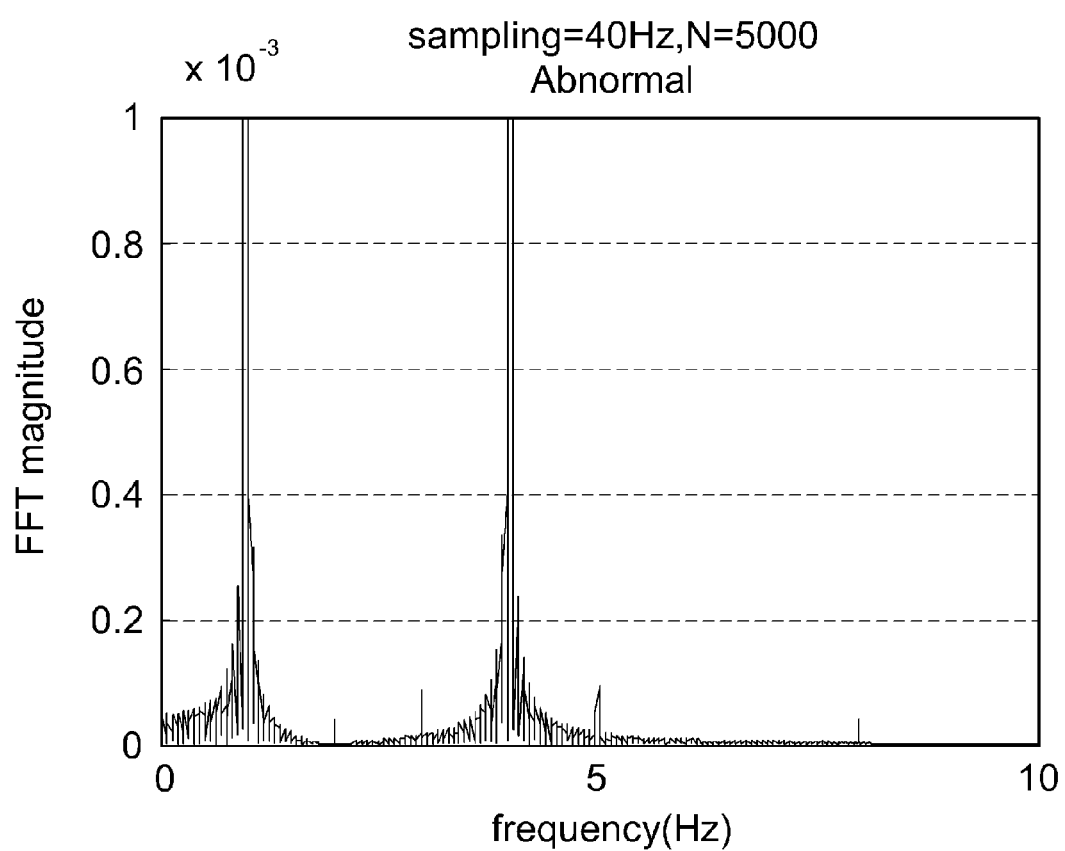
FIG. 5 is an amplitude diagram obtained by a fast Fourier transform (FFT) analysis of the voltage of the fuel cell stack measured in the present invention.

Moreover, the voltage of the fuel cell stack measured by applying an external multiple frequency test current is analyzed by a fast Fourier transform (FFT), an example of which is shown in FIG. 5.

In particular, FIG. 5 is an amplitude diagram obtained by an FFT analysis of the voltage of the fuel cell stack measured in the present invention (test signal frequency: $f_1=1$ Hz and $f_2=4$ Hz, harmonics: $f_1$, $2f_1$, $f_2-f_1$, $f_2$, $f_2+f_1$, $2f_2$).

Moreover, in the present invention, the total harmonic distortion (K) can be calculated by the following formula 3:

$$K = \sqrt{Y_3^2 + Y_4^2 + Y_5^2 + \ldots} \quad \text{[Formula 3]}$$

When the THD (K) calculated in the above manner is analyzed (by comparing reference values, etc.), it is possible to determine the abnormal state of the fuel cell stack due to an omission of a cell, for example.

As such, in the present invention, a current or voltage signal having at least two frequency characteristics as the test signal for frequency response is applied to the fuel cell stack and the resulting current or voltage signal output from the fuel cell stack is measured to infer the operational state of the fuel cell stack from a change in the harmonic content and the amplitude of the measured current or voltage signal, thus improving the analytical capability (e.g., more than two times).

As described above, the monitoring technique according to the present invention can monitor the operational state of the unit cells of the fuel cell stack and the occurrence of deterioration in performance in real time with a simple device configuration, and thus it is possible to perform real-time monitoring, reduce the cost, and increase the stability due to a reduction in circuitry. Moreover, it is possible to further improve the analytical capacity by the use of the multiple frequency test signal for frequency response.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A method for monitoring an operational state of a fuel cell stack, the method comprising:
    applying a multiple frequency test signal for frequency response to the fuel cell stack during operation of the fuel cell stack, the test signal comprising at least two sinusoidal waves;
    measuring a resulting signal output from the fuel cell stack, the resulting signal selected from either a current or voltage; and
    analyzing a harmonic content of the resulting signal output from the fuel cell stack to detect nonlinearity in the operational state of the fuel cell stack,
    wherein the monitoring is performed by a monitoring device, the monitoring device including a current signal generator configured to generate the test signal having at least two frequency characteristics for frequency response, the current signal generator applying the test signal for frequency response to a load connection terminal of the fuel cell stack through a signal line connected between the load connection terminal of the fuel cell stack and a load to infer an operational state of the fuel cell stack from a change in harmonic content and an amplitude of the measured resulting signal,
    wherein the test signal for frequency response is a multiple frequency current comprising two different sinusoidal signals in the form of $[B_1 \sin(\omega_1 t) + B_2 \sin(\omega_2 t)]$, wherein B1 and B2 represent amplitudes of the two different sinusoidal signals respectively, and $\omega_1$ and $\omega_2$ represent frequencies of the two different sinusoidal signals respectively.

2. The method of claim 1, wherein analyzing comprises subjecting the resulting signal output from the fuel cell stack to frequency transformation to calculate a total harmonic distortion (THD).

3. The method of claim 1, wherein analyzing comprises subjecting the measured voltage of the fuel cell stack to frequency transformation to calculate a total harmonic distortion (THD).

4. The method of claim 3, wherein the total harmonic distortion K is calculated as:

$$K = \sqrt{Y_3^2 + Y_4^2 + Y_5^2 + \ldots}$$

wherein the measured voltage of the fuel cell stack is represented by the following formula E1 after the frequency transformation:

E1: $V(t) = Y_0 + Y_1 \sin(\omega_1 t) + Y_2 B \sin(\omega_2 t) + Y_3 \sin(2\omega_1 t) + Y_4 \sin((\omega_2 - \omega_1)t) + Y_5 \sin(2\omega_2 t) + Y_6 \sin((\omega_1 + \omega_2)t) \ldots$ wherein $Y_0, Y_1, Y_2, Y_3, Y_4, Y_5$ and $Y_6$ represent amplitudes of the respective sinusoidal signals.

5. The method of claim 1, wherein the fuel cell stack is a vehicle fuel cell stack.

* * * * *